United States Patent [19]
Roth et al.

[11] Patent Number: 5,091,697
[45] Date of Patent: Feb. 25, 1992

[54] LOW POWER, HIGH ACCURACY MAGNETOMETER AND MAGNETIC FIELD STRENGTH MEASUREMENT METHOD

[75] Inventors: Stephen A. Roth, Aumsville; Roar Berg-Johansen, Salem, both of Oreg.

[73] Assignee: II Morrow, Inc., Portland, Oreg.

[21] Appl. No.: 388,579

[22] Filed: Jul. 31, 1989

[51] Int. Cl.⁵ .................... G01R 33/04; G01C 17/28
[52] U.S. Cl. ................... 324/253; 324/247; 33/361
[58] Field of Search ............ 324/247, 253-255; 33/361

[56] References Cited

U.S. PATENT DOCUMENTS

| | | | |
|---|---|---|---|
| 4,277,751 | 7/1981 | Lawson et al. | 324/254 |
| 4,305,035 | 12/1981 | Mach et al. | 324/255 |
| 4,859,944 | 8/1989 | Webb | 324/253 |

*Primary Examiner*—Walter E. Snow
*Attorney, Agent, or Firm*—William A. Birdwell

[57] ABSTRACT

A magnetometer and method for measuring magnetic field strength particularly adapted for use in an electronic flux gate compass. A core of magnetic material in the shape of a toroid is coupled to a drive coil and to two sense coils oriented along orthogonal axes. A current limited, current source coupled to the drive coil periodically saturates the core, drives the core out of saturation at an intermediate current level, and saturates the core again. Each sense coil is coupled to a sense circuit which measures the current in the sense coil induced by the periodically changing flux density in the coil resulting from an external magnetic field coupled to the sense coil, produces a dc feedback signal to cancel out the external magnetic field, and provides the dc signal as an output representative of the external magnetic field strength along the axis of the sense coil. The dc signal is produced by synchronously detecting the amplified ac current in the sense coil. Low pass filters are provided to eliminate ac components from the magnetometer output.

26 Claims, 4 Drawing Sheets

LOW POWER, HIGH ACCURACY MAGNETOMETER AND MAGNETIC FIELD STRENGTH MEASUREMENT METHOD

BACKGROUND OF THE INVENTION

This invention relates to magnetometers and magnetic field strength measurement methods, particularly for use in an electronic compass.

In navigation and vehicle tracking operations it is important to be able to determine directions with a high degree of accuracy. It is also important to be able to provide directional data to electronic systems which are employed to accomplish guidance and tracking computations, particularly where the vehicle involved is moving relatively rapidly so that manual processing of the directional data for navigation or tracking is impractical. This is often accomplished using an electronic magnetometer which measures the magnitude of the earth's magnetic field. Ordinarily, the field strength is measured in two different directions, typically 90 degrees apart, so that the orientation of the magnetometer can be computed trigonometrically from the results of those measurements, thereby providing an electronic compass.

One way of measuring magnetic field strength electronically is through the use of Hall effect devices. When placed in a magnetic field, such devices provide a voltage output related to the strength of the magnetic field. While Hall effect devices are generally low in cost and readily available, most of them are not sensitive enough to be used for an electronic compass. Those which may be sensitive enough to use in an electronic compass are relatively expensive.

Another way of measuring magnetic field strength electronically is to use a magnetic core based on the flux gate theory. In this technique, a core of magnetic material is magnetically coupled to a sense coil, which is wound around the core, and the core is periodically driven into saturation by a control field applied by a coil which is typically separate from the sense coil. When the magnetic material is not saturated, its permeability is high, so that the core flux density of any external magnetic field in which the core is placed is also high. However, when the core is saturated by the control field, its permeability is low, so that the external magnetic field is not drawn into the core and the core flux density of any such field is low. The change in flux density when the core is driven into saturation and back out induces an electromotive force in the sense coil which, when the coil is connected to a load, produces a current through the coil related to the strength of the external magnetic field. In magnetometers heretofore known, the induced voltage is measured and used to produce a signal representative of the strength of the external magnetic field. Such flux gate devices provide the necessary sensitivity for an electronic compass and are less expensive than comparable Hall effect devices.

One of the problems encountered in designing an accurate flux gate compass is that the voltage produced by the sense coil is a function not only of the strength of the external magnetic field, but also the magnetization of the magnetic material, i.e., the relationship of the magnetic flux density to the magnetic field strength in the core material, which is non-linear and relatively unpredictable from core to core. This has typically been overcome by using feedback from the voltage generated by the sense coil to produce and apply to the core a magnetic field that cancels out the external magnetic field so that the core characteristics are not a factor. The current needed to produce the cancellation field is indicative of the strength of the external magnetic field.

However, there are other problems encountered in the design of an accurate flux gate compass that have heretofore not been overcome. One such problem is that by measuring the voltage produced by a sense coil it is difficult to achieve a high degree of accuracy. This is because the voltage produced by the coil is dependent not only on the external magnetic field strength, but also on the rate of change of the magnetic field and the magnetization properties of the core. That the voltage is dependent on the rate of change of magnetic flux in the core makes voltage measurement very sensitive to changes in the frequency of the signal that drives the control field.

Another problem is that the time needed to switch the core from the unsaturated state to the saturated state and back reduces the accuracy with which the signal produced by the sense coil can be converted to a signal representative of the strength of the external magnetic field.

A further problem with prior flux gate magnetometers is that saturation of the core leads to excessive current flow in the drive coil, producing power consumption and dissipation problems.

Flux gate magnetometers are described, for example, in Mach et al. U.S. Pat. No. 4,305,035, entitled "Magnetic Field Amplitude Detection Sensor Apparatus", in Rhodes U.S. Pat. No. 4,300,095, entitled "Self Excited Field Saturable Core Magnetic Field Detection Apparatus", in Rhodes U.S. Pat. No. 4,290,018, entitled "Magnetic Field Strength Measuring Apparatus With Triangular Waveform Drive Means", and in Mound et al. U.S. Pat. No. 3,605,011, entitled "Control Apparatus". However, all of these devices measure the voltage produced by the sense coil, and all appear to provide no solution to the problems of core characteristic variability, switching speed and power consumption and dissipation.

Thence, there is a need for an electronic magnetometer and magnetic field strength measurement method that is more tolerant of component variability than those heretofore available and which reduces power consumption and dissipation problems.

SUMMARY OF THE INVENTION

The present invention provides an electronic flux gate magnetometer and method for measuring magnetic field strength which overcomes the aforementioned problems of electronic magnetometers. It provides high measurement accuracy, rendering it particularly suitable for use in an electronic flux gate compass, and low power consumption.

The magnetometer of the present invention employs a toroid magnetic core periodically driven first into saturation, then out of saturation, and thereafter back into saturation by a current applied to a drive coil wound around the toroid. The drive coil is driven by a current limited current source circuit, which prevents excessive power consumption when the core is saturated.

Sense coils oriented at 90 degrees from one another are wound around the toroid along respective orthogonal axes. For each sense coil, a respective sense circuit measures the current in the coil induced by the modulated magnetic flux under measurement and produces a sense signal representative thereof. Each sense circuit uses an operational amplifier which employs the sense signal as negative feedback to produce a virtual ground at the sense coil input, thereby ensuring that current in the coil is being measured. That also ensures that the coil is substantially shorted so as to maximize the time for the field in the coil to change and thereby minimize the time dependency of the current in the coil.

The sense signal of each sense circuit is also synchronously detected to produce a dc feedback signal which creates a magnetic field that substantially cancels the external magnetic field whose strength is being measured. This decreases sensitivity of the sense circuit to characteristics of the magnetic core. For sensitive and polarity-dependent rectification, the sense signal is synchronously detected, the detector being activated by the current signal that periodically saturates and unsaturates the core.

The sense signal of each sense circuit is low pass filtered to eliminate ac components and provide a dc output signal representative of the strength of the external magnetic field along the axis of its corresponding sense coil.

Accordingly, it is a principal objective of the present invention to provide a novel and improved magnetometer and magnetic field strength measurement method.

It is another objective of the present invention to provide a magnetometer and magnetic field strength measurement method which provides a high degree of accuracy.

It is a further objective of the present invention to provide a magnetometer and magnetic field strength measurement method which exhibits low power consumption.

It is yet another objective of the present invention to provide a magnetometer and magnetic field strength measurement method which is particularly adapted for use in an electronic flux gate compass.

It is a principal feature of the present invention to provide a magnetometer and magnetic field strength measurement method employing the flux gate principle which measures the current in a sense coil coupled to a magnetic core employed as part of a flux gate.

It is another feature of the present invention to provide a magnetometer and magnetic field strength measurement method employing the flux gate principle wherein the time for change of the magnetic field in the sense coil is maximized.

It is a further feature of the present invention to provide a magnetometer and magnetic field strength measurement method employing the flux gate principle wherein the field being measured is cancelled so as to reduce the effect of nonlinearities of the magnetic core.

It is yet another feature of the present invention to provide a magnetometer and magnetic field strength measurement method employing the flux gate principle wherein the drive current to the magnetic core is current limited to reduce power consumption during saturation.

It is yet a further feature of the present invention to provide a magnetometer and magnetic field strength measurement method employing the flux gate principle wherein the time required to switch the magnetic core is minimized from an unsaturated state to a saturated state.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

FIG. 8(h) is a waveform illustrating the dc output signal in the sense circuit of the magnetometer of FIG. 4.

DESCRIPTION OF THE PREFERRED EMBODIMENT

Figure 1:
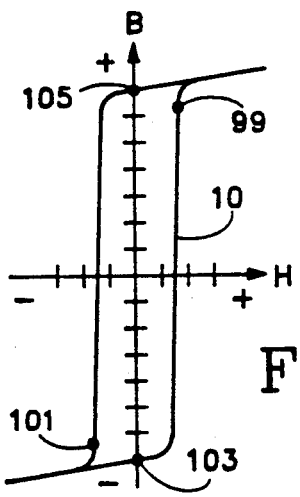
FIG. 1 is an exemplary graph of the magnetization curve of magnetic material of the type used in a magnetic core according the present invention.

Referring first to FIG. 1, which shows the magnetization curve of a magnetic material, i.e., a graph of the magnetic flux density "B" as a function of the magnetic field intensity "H", it can be seen that as the magnetic field intensity H increases, the magnetic flux density B remains nearly constant until a point is reached where it rises very rapidly to a nearly constant magnitude. When a magnetic field of opposite polarity is then applied, the same thing happens in the opposite direction. The states of nearly constant magnetic flux density are known as saturation. When the material is saturated, it has a very low magnetic permeability, i.e., high magnetic reluctance, and when it is not saturated, it has a very high magnetic permeability, i.e., a relatively low magnetic reluctance. When its permeability is low, the magnetic material will have little effect on an external magnetic field, such as the earth's magnetic field, in which it is placed. But when its permeability is high, the low reluctance of the material will tend to cause an external magnetic field to pass through the material rather than the nearby space, which has lower permeability. It is this characteristic of magnetic material which is employed in an electronic flux gate compass to measure the strength of a magnetic field.

Figures 2A, 2B:
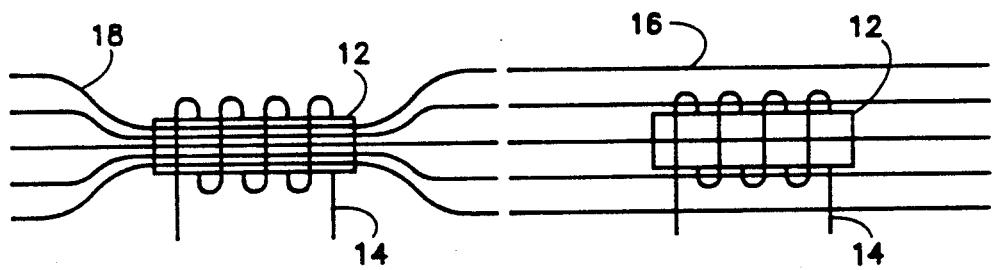
FIG. 2(a) is a diagram of how a saturated core of magnetic material affects an external magnetic field.
FIG. 2(b) is a diagram of how an unsaturated core of magnetic material affects an external magnetic field.

In a flux gate compass the magnetic field intensity H in a core of magnetic material is determined primarily by the current in a drive coil coupled to the core. However, it is also affected by the earth's magnetic field which the compass is to measure. FIGS. 2(a) and (b) illustrate the flux gate principle. In FIG. 2(a) a cylindrical core of magnetic material 12 is coupled to a drive coil 14, which is wound on the core around its elongate axis. When there is sufficient current in the drive coil 14 to produce a magnetic field intensity in the core 12 which saturates the core, the external magnetic field, represented by flux lines 16, is relatively unaffected by the presence of the core. But, as shown in FIG. 2(b), when there is insufficient current through coil 14 to saturate the core, the external magnetic field tends to pass through the core 12, rather than the surrounding space, as shown by the flux lines 18. The change in flux density within the core when it is switched from a saturated condition to an unsaturated condition, and vice versa, will induce an electromotive force, or voltage, in a sense coil magnetically coupled to the core 12. That voltage is a function of the strength of the external magnetic field.

Figure 3:
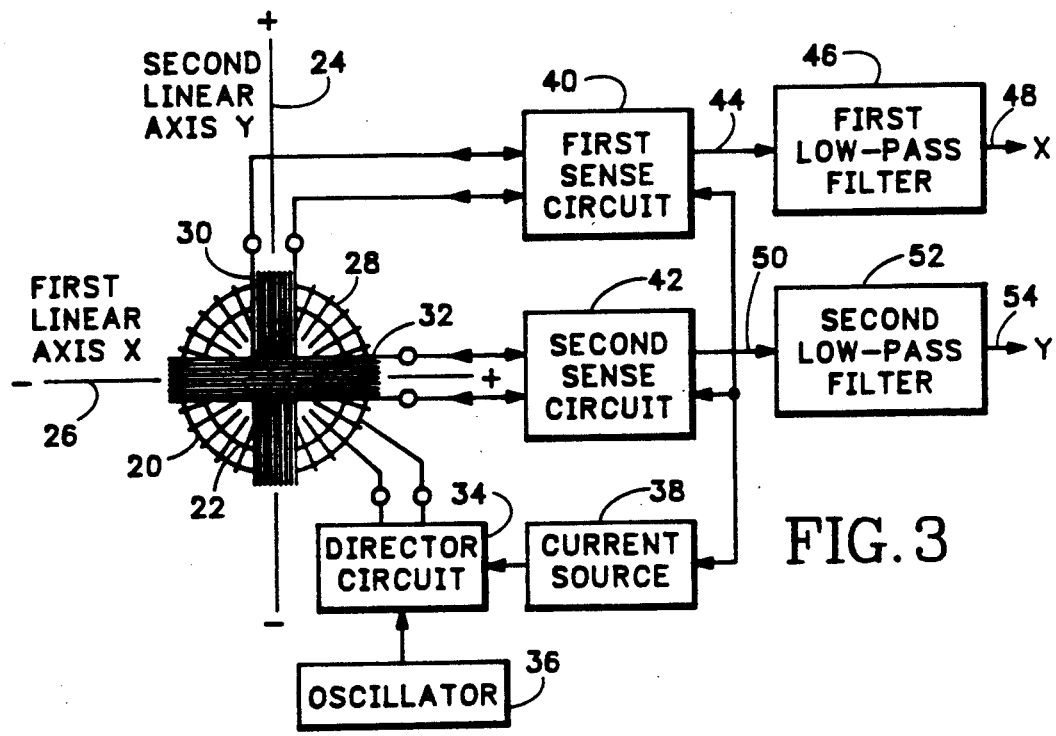
FIG. 3 is a block diagram of an electronic flux gate compass magnetometer according to the present invention.

Turning now to FIG. 3, which shows a block diagram of an electronic flux gate magnetometer according to the present invention, the core 20 comprises a toroid of magnetic material. The core is made of a suitable magnetic material such as Permalloy. For purposes of explanation of the invention, the toroid will be defined as having an endless circular axis 22 disposed halfway between the inside of the torus and the outside of the torus, a first linear axis 24, lying in the same plane as the circular axis 22 and passing through the center of the torus, and a second linear axis 26, lying in the same plane as the circular axis 22 and passing through the center of the torus, the first and second linear axis preferably being oriented at 90° to one another.

A drive coil 28 is wound on the toroid around the circular axis. Thence, the magnetic control field produced by the drive coil when a current flows therein will be confined to the toroid. But, the external magnetic field will be affected by the permeability of the toroid, as controlled by the current in the drive coil. A first sense coil 30 is wound on the toroid around the first linear axis 26. A second sense coil 32 is wound on the toroid around the second linear axis 24. Thence, the first and second sense coils are coupled both to the magnetic core 20 and to the surrounding space so that any change in the external magnetic field in which the core is placed can be detected by the sense coils.

The drive coil 28 is connected to a steering circuit 34 which controls the direction of current in the drive coil. The steering circuit is controlled by an oscillator 36 which provides a bi-phase signal to the steering circuit for controlling the frequency, timing and shape of the drive current waveform applied to the drive coil 28. The current in the drive coil is supplied and controlled by current source 38. The current source and oscillator also provide timing signals to a first sense circuit 40 and a second sense circuit 42.

A first sense coil 30 is connected to the input of the first sense circuit 40. The second sense coil 32 is connected to the input of the second sense circuit 42. The first and second sense circuits 40 and 42, respectively, measure the current in the first and second sense coils 30 and 32, respectively, and provide to those coils a dc feedback signal to cancel out the component of external magnetic field experienced by the respective coil. The output of the first sense circuit 40 is a first sense signal 44 which is applied to a first low pass filter 46 to produce a first magnetometer output signal 48 representative of the strength of the external magnetic field along the first linear axis. The second sense circuit 42 provides a sense signal output 50 which is applied to a second low pass filter 52 to produce a second magnetometer output 54 representative of the strength of the external magnetic field along the second linear axis 24.

Figure 4:
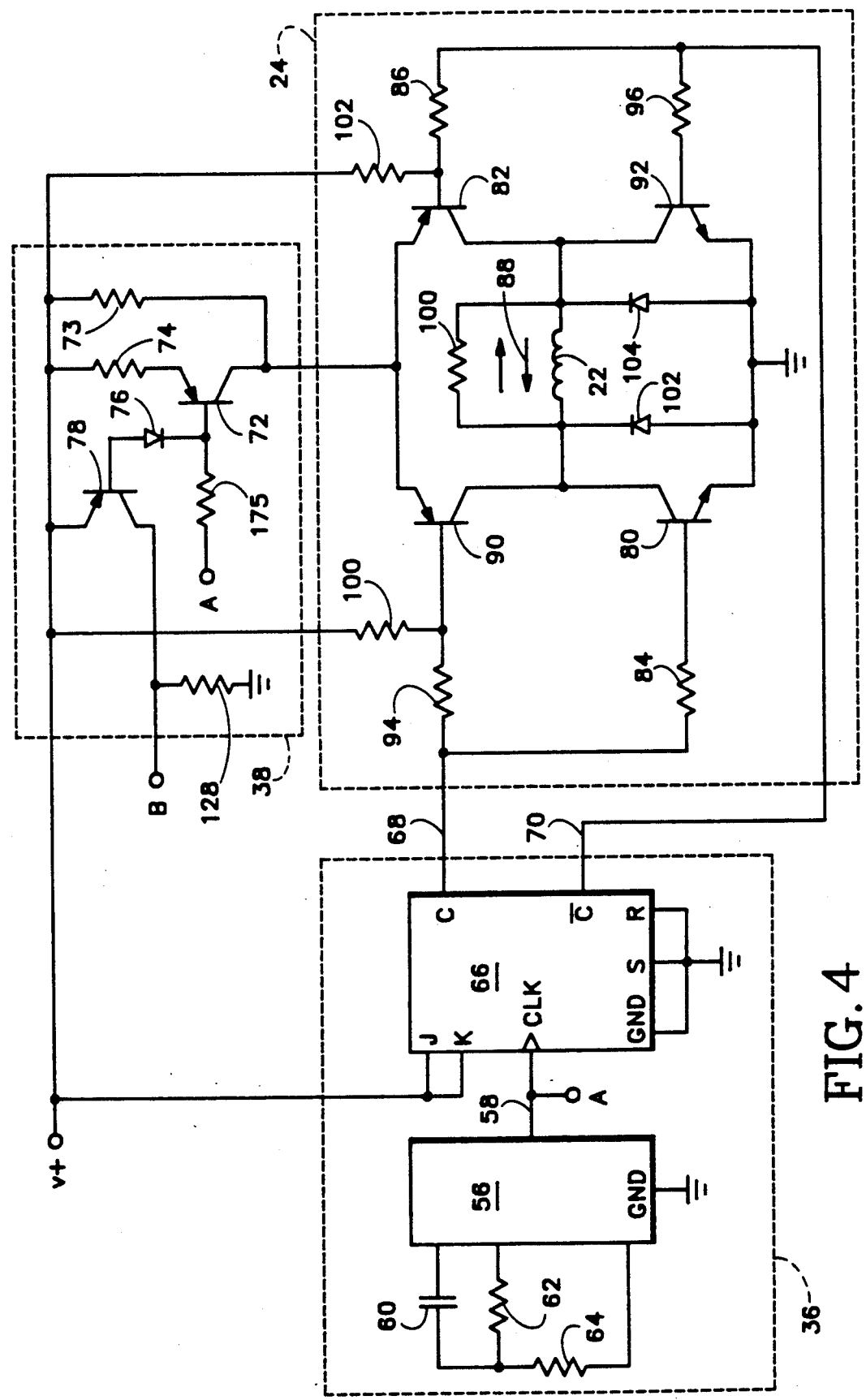
FIG. 4 is a schematic diagram of the magnetometer of FIG. 3.
Figure 4:
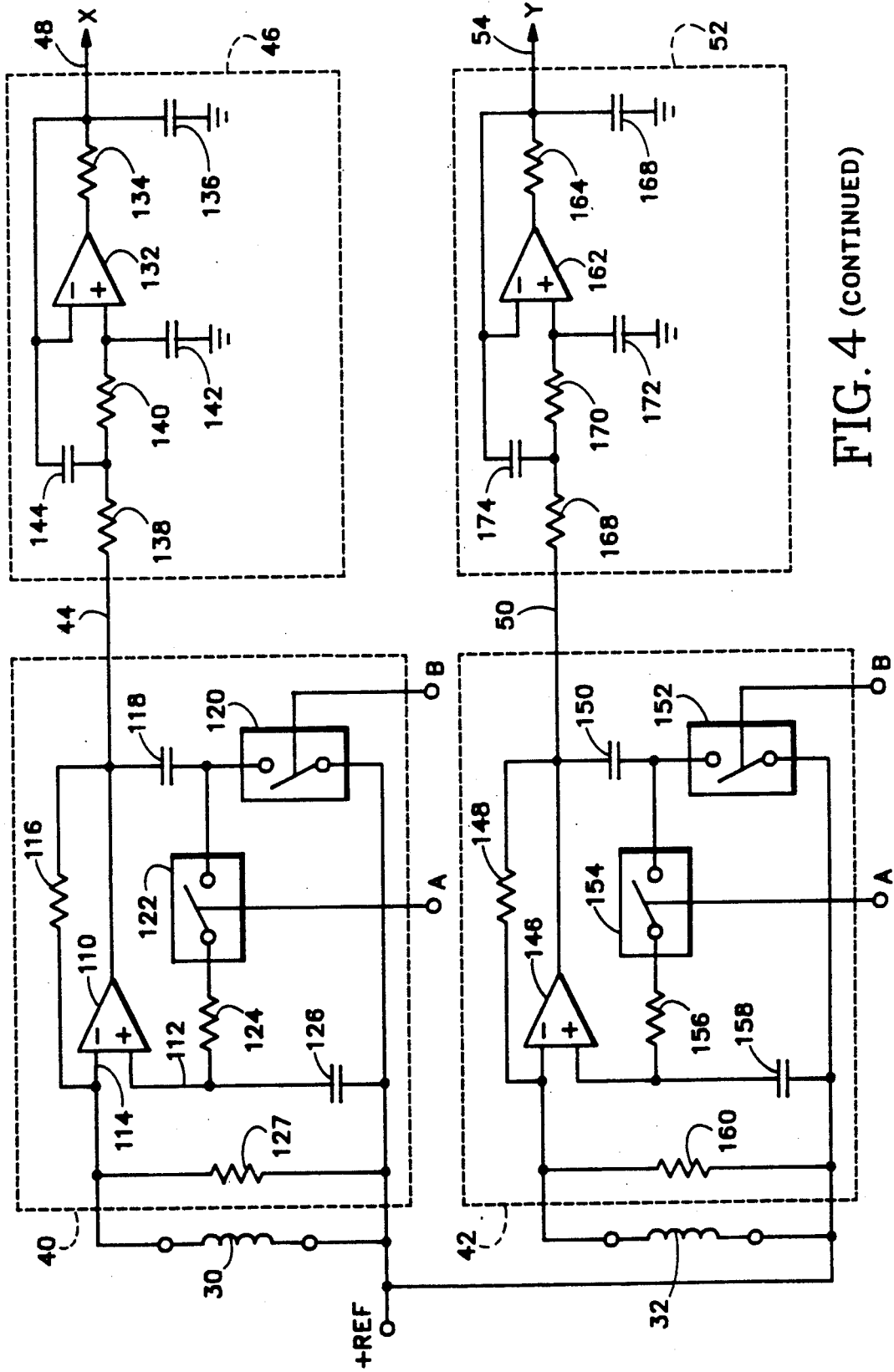

FIG. 4 shows a schematic diagram of a preferred circuit for implementing the magnetometer of FIG. 3. In that schematic, the parts corresponding to the blocks in the block diagram are identified by like numbers, as are the drive coil 28, the first sense coil 30 and the second sense coil 32. Power connections are generally not shown, as they are commonly understood by persons skilled in the art.

Figure 5A:
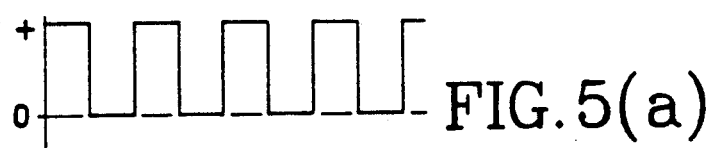
FIG. 5(a) is a waveform illustrating an oscillator signal in the magnetometer of FIG. 4.

The oscillator 36 employs a multivibrator integrated circuit 56, for example, the commonly known 4060 device, which produces at output 58 a rectangular wave output having high and low values and whose frequency and pulse width are determined by capacitor 60, and resistors 62 and 64. Preferably, these components are chosen to drive that core at a frequency of about 5 kHz. The pulse width is preferably selected so that the output 58 is a square wave, as shown in FIG. 5(a).

Figure 5B:
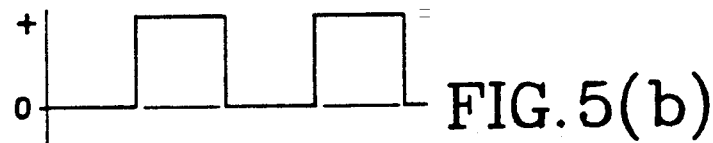
FIG. 5(b) is a waveform illustrating another oscillator signal in the magnetometer of FIG. 4.
Figure 5C:
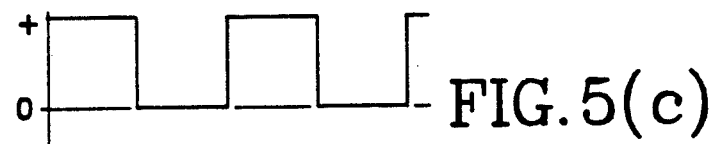
FIG. 5(c) is a waveform illustrating a further oscillator signal in the magnetometer of FIG. 4.

The output 58 drives a JK flip flop 66 which produces a bi-phase output. That is, it produces a Q output 68 which toggles between 0 ("low") and 1 ("high") in response to the leading edge of each clock pulse, as shown in FIG. 5(b), and a $\overline{Q}$ output 70 which is the inverse of the Q output, as shown in FIG. 5(c). These outputs drive the steering circuit 34.

Current is supplied to the steering circuit 34, and thereby to the drive coil 28, either through resistor 73 or through transistor 72 and resistor 73, depending on the output 58 of multivibrator 56. When output 58 is high, no current will flow through resistor 75 and transistor 72 will be turned off. Under this condition current can only flow to the steering circuit 34 through resistor 73. When output 58 is low, the base-emitter junction of transistor 72 will be forward biased and that transistor will be turned on. Under this condition, current can flow to the steering circuit 34 through both resistor 73 and transistor 72, but it will primarily flow through transistor 72 because resistor 73 is much larger than resistor 74, e.g., about 20 times larger.

The maximum amount of drive current which will be supplied to the drive coil 28 when transistor 72 is turned on is limited by transistor 72, resistor 74, diode 76 and the base-emitter junction of transistor 78. As more current is drawn by the steering circuit 34 to drive the coil 28, the voltage drop across resistor 74 increases. But, the voltage drop across resistor 74 cannot exceed the total voltage drop across diode 76 and the base-emitter junction of transistor 78 less the voltage drop across the base-emitter junction of transistor 72, which is essentially constant, or transistor 72 would be turned off. Thence, the current through resistor 74, steering circuit 34 and drive coil 28 cannot exceed an amount that would cause the voltage drop across resistor 74 and the base-emitter junction of transistor 72 to exceed the total voltage drop across the base-emitter junction of transistor 78 and diode 76. This current limiting prevents excessive current flow in the drive coil 28, and concomitant power consumption and dissipation, when the core is saturated.

Turning now to the steering circuit 34, it can be seen how the oscillator 36, current source 38 and steering circuit 34 shape the drive current through the coil 28. When the Q output 68 of flip flop 66 is high and the $\overline{Q}$ output 70 is low, the base-emitter junctions of transistors 80 and 82 are forward biased through resistors 84 and 86, respectively, so as to turn on those transistors and cause current to flow through the coil 28 in a first direction, as shown by arrow 88. When the $\overline{Q}$ is high and the Q output 68 is low, the base-emitter junctions of transistors 90 and 92 are forward biased through resistors 94 and 96, respectively, so as to turn on those transistors and cause current to flow through coil 28 in a second direction, as shown by arrow 98.

However, current can only flow in either direction to the extent that it is provided by current source 38. During two quarters of each cycle of the outputs 68 and 70 of the flip flop 66, transistor 72 in the current source 38 is turned off by the output 58 of multivibrator 56. During those quarters current is supplied to the steering circuit 34 by resistor 73. The amount of that current is determined either by resistors 95 and 94, or by resistors 97 and 86, depending upon whether output 68 or output 70 of flip flop 66 is low at the time.

If, for example, output 68 is low, while output 58 of multivibrator 56 is high, transistor 90 becomes a constant current source for coil 28 because the amount of current through resistor 73 is set by the base voltage, which is determined by the resistor divider network comprising resistor 95 and 94. The same thing happens at transistor 82 when output 70 is low.

Figure 5D:
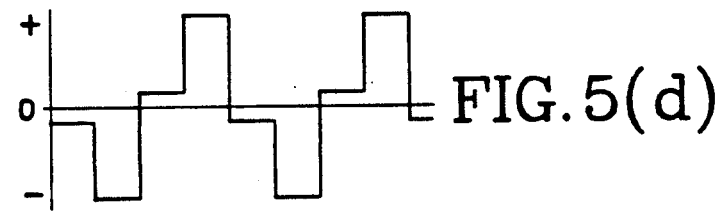
FIG. 5(d) is a waveform illustrating the magnetic core drive current in the magnetometer FIG. 4.

As a result of the action of the oscillator 36, current source 38 and steering circuit 34, the current through drive coil 28 is as shown in FIG. 5(d). In order for the magnetic core to concentrate the flux of an external magnetic field, it must be unsaturated. By providing an intermediate level of current through the coil between the two saturation extremes, the core is caused to concentrate the flux of the external field for a specific period of time during which the field can be measured. Referring again to the magnetization curve in FIG. 1, during those intermediate levels the core has operating points 99 or 101, depending on which direction the current is flowing through the coil 28.

Figure 5E:
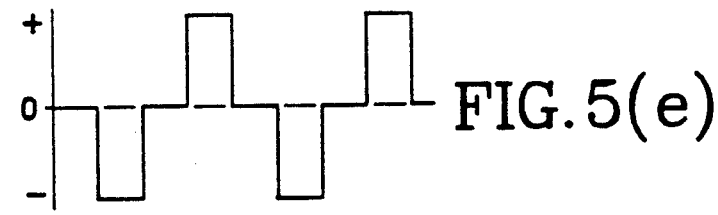
FIG. 5(e) is a waveform illustrating a hypothetical core drive current in the magnetometer of FIG. 4.

Without resistor 73, the waveform of the current through the coil 28 would be as shown in FIG. 5(e). In that case the operating points of the core would be 103 and 105, which would require more time for the core to become saturated as a result of a change in the direction of current after the intermediate current level. By allowing some current to flow so as to reduce the time to become saturated after the intermediate level, a more definite transition is produced at the sense coils, as described below, which produces more accuracy.

When the drive current in coil 28 is switched from saturation to an intermediate level in one direction, it initially produces a high back electromotive force. Resistor 100 is provided to allow some of the current initially to flow through resistor 100 and thereby reduce the back electromotive force. This prevents the voltage across coil 28 from becoming so high as to prevent transistors 82 and 90 from acting as effective current sources. When the coil is switched from saturation to an intermediate current level in the other direction it produces a negative going spike on the side which is low. In order to prevent that spike from excessively reverse-biasing the base-emitter junctions of transistors 80 and 92, and thereby causing the base-emitter junctions to break down, diodes 102 and 104 are provided.

Turning now to the sense circuits, sense circuit 40 comprises an operational amplifier 110 having a non-inverting input 112 and an inverting input 114 as well as sense signal output 44. Negative feedback from the output 44 to the inverting input 114 is provided by feedback resistor 116. That makes the inverting input a virtual ground, and renders the amplifier circuit a transimpedance amplifier.

In the conventional approach a sense coil is ordinarily loaded by a relatively high impedance so that it is virtually open circuited and behaves according to Faraday's law of induction; that is, the voltage across the coil will be proportional to the rate of change of flux through the coil and very little current will flow in the coil. Thence, the induced voltage in the sense coil of a conventional device is a positive or negative voltage impulse at each transition from a saturation drive coil current level to an intermediate current level and back again.

Figure 5F:
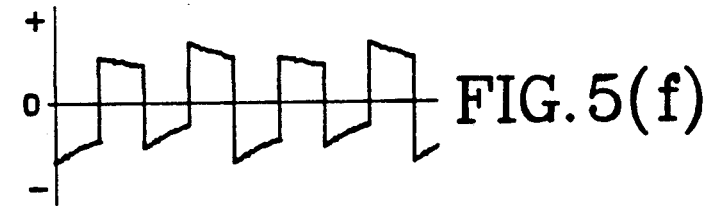
FIG. 5(f) is a waveform illustrating the ac current in a sense coil of the magnetometer of FIG. 4.

In the present invention, the sense coil 30 is applied to a virtually zero impedance load, and produces a current waveform generally as shown in FIG. 5(f). When the magnetic flux through the gated magnetic core attempts to change, the induced voltage produces a current in the sense coil that opposes the change, in accordance with Lenz's law. The current in the sense coil for a step change in flux is described by the following equation:

$$i(t) = \frac{C}{L} \phi(t) \cdot e^{-\frac{R}{L} t}$$

wherein
i = current in the sense coil,
L = inductance of the sense coil,
R = source resistance of the sense coil plus the load resistance,
t = time,
$\phi$ = the flux in the sense coil, and
C = a constant.

Thence, if there were no source resistance in the coil and no load resistance, and the flux path is gated on and off, then the current in the coil would be a square wave. In practice, the coil has a finite series resistance which causes the current to change with time. This produces an exponential decay with a time constant L/R as shown by the above equation and illustrated in FIG. 5(f).

Figure 5G:
FIG. 5(g) is a waveform illustrating a hypothetical ac current in a sense coil of the magnetometer of FIG. 4.

The non-inverting input 114 of the operational amplifier 110 is connected to the reference (+REF) through the low impedance of capacitor 126. Since there is no voltage across the two inputs of the operational amplifier 110, the coil 30 is essentially shorted. However, the operational amplifier has some internal delays which cause oscillations to develop. Resistor 127 is provided to dampen those oscillations. Without resistor 127, the current waveform would be as shown in FIG. 5(g).

The ac signal at output 44 of the operational amplifier 110 is rectified by a synchronous detector. The synchronous detector comprises capacitor 118, electronic switch 120, electronic switch 122, resistor 124 and capacitor 126. The electronic switches 120 and 122 may be, for example, commonly known 4066 analog switches. The electronic switches 122 and 120 are actuated by signals applied at points A and B, respectively. The signals at points A and B are derived from the oscillator 36 and current source circuit 38, respectively. When the multivibrator output signal 58 is high, switch 122 is closed. But, when the output signal 58 is low, diode 76 conducts through resistor 75 and turns on transistor 78, which causes the voltage at point B to go high and thereby causes switch 120 to close. Resistor 128 allows the voltage at point B to go back to zero when transistor 78 is turned off.

When switch 122 is open and 120 is closed, which occurs during every other sense current pulse, positive or negative, as shown in FIG. 5(f), capacitor 118 is charged to the average value of the operational amplifier output 44 with respect to the reference, during the time the switch is closed. Then, when switch 120 is open and switch 122 is closed, which occurs during the remaining sense current pulses, capacitor 126 is charged through resistor 124 to the voltage across capacitor 118 plus the voltage at output 44. After a few cycles, the voltage across capacitor 126 is proportional to the value of the operational amplifier output 44, rectified to be either positive or negative depending on the direction of the external magnetic field flux through sense coil 30.

The voltage across capacitor 126 causes dc feedback current to flow through resistor 116 in order to maintain inverting input 114 of the operational amplifier equal to the non-inverting input 112. This causes a current in sense coil 30 which produces a magnetic field that tends to cancel the external magnetic field being measured, and produces a dc signal component at the operational amplifier sense signal output 44. This tends to reduce the ac signal at the output 44, as that ac signal is caused by detecting flux in the sense coil from the external magnetic field being measured. In a state of equilibrium, the external field will be almost cancelled out by the dc feedback of the sense circuit, which will be maintained by a very small ac signal at the sense signal output 44.

Figure 5H:
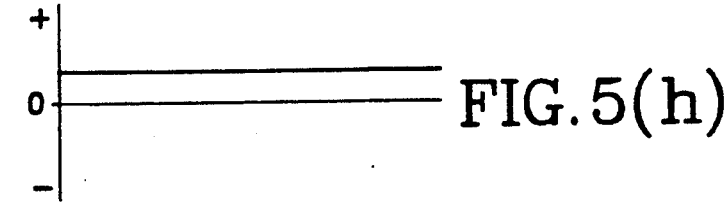

The low pass filter circuit 46 serves several purposes. As there is a small ac component as well as a dc component in the sense signal output 44 of sense circuit 40, low pass filter 46 serves to eliminate the ac component so as to produce a dc signal, as shown in FIG. 5(h). In addition to the small ac component produced by the operation of the flux gate and sense circuit, there are often ac components of 60 Hz and multiples thereof caused by varying external magnetic fields from power sources that are coupled to the sense coil. The low pass filter serves mainly to eliminate these ac components. The low pass filter also serves to decouple the magnetometer output 48 from the sense circuit 40, so as to prevent any effect on the operation of circuit 40 by the loading on the output 48.

Low pass filter 46 comprises operational amplifier 132, output resistor 134 and output capacitor 136. It further comprises resistor 138, resistor 140, capacitor 142 and capacitor 144, which determines the poles of the filter. It is a two pole low pass filter of a design commonly known to persons skilled in the art, and is preferably designed to have a cutoff frequency of about 5 Hz. Capacitor 136 is included to protect the operational amplifier 132 from external transients, and resistor 134 is provided both to protect the operational amplifier from overload and to stabilize the amplifier from oscillation that would otherwise occur due to capacitor 136.

Sense circuit 42 is identical to sense circuit 40. Thence, it has operational amplifier 146 and feedback resistor 148. It has a synchronous detector comprising capacitor 150, electronic switch 152, electronic switch 154, resistor 156, and capacitor 158. And, it has damping resistor 160.

Likewise, low pass filter 52 is identical to low pass filter 46. Thence, it has operational amplifier 162, output resistor 164 and output capacitor 166. It has input resistor 168, resistor 170, capacitor 172 and capacitor 174.

When used as an electronic compass, the magnetometer provides X and Y output signals 48 and 54, respectively, which correspond to the strength of the earth's magnetic field along orthogonal axes. These outputs can then be used to compute, trigonometrically, the orientation of the compass.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

I claim:

1. A magnetometer, comprising:
   (a) a core of magnetic material;
   (b) drive means for periodically applying a control magnetic field to said core to saturate said core;
   (c) a first sense coil magnetically coupled to said core; and
   (d) first sense circuit means connected to said first sense coil for providing a sense signal representative of the current in said first sense coil, said first sense circuit means comprising an operational amplifier having an inverting input and an output which produces said sense signal and a feedback path from sad output to said inverting input so as to render said inverting input a virtual ground, said first sense coil being connected to said inverting input.

2. The magnetometer of claim 1 further comprising first low pass filter means coupled to said output of said operational amplifier for providing as a magnetometer output a signal representative of an external magnetic field coupled to said sense coil.

3. The magnetometer of claim 1, wherein said sense circuit further comprises means for rectifying said sense signal and applying the rectified sense signal to said sense coil to reduce any external magnetic field coupled thereto.

4. The magnetometer of claim 3, wherein said means for rectifying comprises a synchronous detector synchronized with said control magnetic field.

5. The magnetometer of claim 4, wherein said drive means comprises a drive coil magnetically coupled to said core, and current source means for applying to said drive coil a periodic current, said synchronous detector being coupled to said current source means for synchronizing said synchronous detector with said periodic current.

6. The magnetometer of claim 5, wherein said current source means comprises means for periodically first applying an amount of current to said drive coil to drive said core into saturation, then applying an amount of current in the opposite direction to take said core out of saturation, and thereafter applying an amount of current sufficient to drive said core into saturation.

7. The magnetometer of claim 5, wherein said core comprises a toroid, said drive coil being wound around the circular axis of said toroid and said sense coil being wound around a first linear axis of said toroid.

8. The magnetometer of claim 7, further comprising a second sense coil wound around a second linear axis of said toroid, said second linear axis being perpendicular to said first linear axis, a second sense circuit means coupled to said second sense coil, and first and second low pass filter means coupled to the outputs of said first and second sense circuit means, respectively, for low pass filtering said sense signals and thereby providing respective magnetometer outputs representative of the strength of an external magnetic field coupled to said sense coils along said first and second linear axes, respectively.

9. A magnetometer, comprising:
   (a) a core of magnetic material;
   (b) drive means for periodically applying a control magnetic field to said core to saturate said core;
   (c) a first sense coil majestical coupled to said core; and
   (d) first sense circuit means connected to said first sense coil for providing a sense signal representative of the current in said first sense coil, said first sense circuit means including means for providing to said first sense coil a load impedance of substantially zero.

10. A magnetometer, comprising:
    (a) a core of magnetic material;
    (b) drive means for periodically applying a control magnetic field to said core to saturate said core;
    (c) first sense coil magnetically coupled to said core; and
    (d) first sense circuit means connected to said first sense coil for providing a sense signal representative of the current in said first sense coil, said first sense circuit means including means for providing a load impedance to said first sense coil, the time constant of said first sense coil and said load impedance together being much greater than the time of application of said control magnetic field to said core.

11. The magnetometer of claim 10, wherein said core comprises a toroid.

12. The magnetometer of claim 11, wherein said drive means comprises a drive coil magnetically coupled to said core and current source means for applying to said drive coil a periodic current, said drive coil being wound around the circular axis of said toroid and said sense coil being wound around a first linear axis of said toroid.

13. The magnetometer of claim 10, wherein said drive means comprises a drive coil magnetically coupled to said core and current source means for to said coil periodically first a current sufficient to drive said core into saturation, then a current in the opposite direction sufficient to take the core out of saturation, and thereafter a current sufficient to drive said core into saturation.

14. The magnetometer of claim 13, wherein said applying a current in the opposite direction sufficient to take the core out of saturation comprises applying current sufficient to drive said core nearly to saturation in the opposite direction.

15. The magnetometer of claim 10, further comprising a second sense coil magnetically coupled to said core, and second sense circuit means for providing a signal representative of the current in said second sense coil, the axis of said second sense coil being oriented perpendicular to the axis of said first sense coil.

16. The magnetometer of claim 15, further comprising first and second low pass filter means coupled to said first and second sense circuit means, respectively, for low pass filtering said sense signals and thereby providing first and second magnetometer outputs representative of the strength of the earth's magnetic field along the axes of said first and second sense coils, respectively, said magnetometer being particularly adapted for use in a flux gate compass.

17. A method for determining the strength of a magnetic field in a given direction, comprising the steps of:
    (a) periodically saturating and unsaturating a core of magnetic material placed in said magnetic field by magnetically coupling a drive coil to said core and periodically applying to said drive coil a drive current first sufficient to saturate said core in one direction, then a current in the opposite direction sufficient to take said core out of saturation and nearly to saturation in said opposite direction, and thereafter a current sufficient to saturate said core in said opposite direction, said core having a first sense coil magnetically coupled thereto; and
    (b) measuring the current induced in said first sense coil by said magnetic field and providing a first sense signal representative of the amplitude of said current, said amplitude being indicative of the strength of said magnetic field.

18. A method for determining the strength of a magnetic field in a given direction, comprising the stpes of:
    (a) periodically saturating and unsaturating a core of magnetic material placed in said magnetic field, said core having a first sense coil magnetically coupled thereto;
    (b) connecting said first sense coil to a load impedance of substantially zero; and
    (c) measuring the current in said first sense coil and providing a first sense signal representative of the amplitude of said current, said amplitude being indicative of the strength of said magnetic field.

19. A method for determining the strength of a magnetic field in a given direction, comprising the steps of:
    (a) periodically saturating and unsaturating a core of magnetic material placed in said magnetic field, said core having a first sense coil magnetically coupled thereto;
    (b) connecting said first sense coil to an operational amplifier having an inverting input and an output which provides said first sense signal, and a feedback path from said output to said inverting input so as to render said inverting input a virtual ground, said first sense coil being connected to said inverting input; and
    (c) measuring the current in said first sense coil and providing a first sense signal representative of the amplitude of said current, said amplitude of said current being indicative of the strength of said magnetic field.

20. The method of claim 19, further comprising a low pass filtering said first sense signal so as to provide an output signal representative of the strength of said magnetic field.

21. The method of claim 19, wherein said measuring step includes rectifying said first sense signal and applying the rectified signal to said sense coil to reduce said magnetic field.

22. The method of claim 21, wherein said rectifying is accomplish by periodically inverting said first sense signal in synchronism with said periodic saturation and unsaturation of said core.

23. The method of claim 22, wherein said periodic saturating and unsaturating said core includes magnetically coupling a drive coil to said core and applying to said drive coil a periodic drive current, said inverting of said first sense signal being synchronized with said periodic current.

24. The method of claim 23, wherein said drive current periodically first drives said core into saturation, then reverses to take said core out of saturation, and thereafter drives said core into saturation.

25. The method of claim 23, wherein said core comprises a toroid, said drive coil being wound around the circular axis of said toroid and said first sense coil being wound around a first linear axis of said toroid.

26. The method of claim 25, further comprising measuring the current in a second sense coil wound around a second linear axis of said toroid perpendicular to said first linear axis, and low pass filtering the sense signals of said first and second sense coils, respectively, thereby providing respective magnetometer outputs representative of the strength of said magnetic field coupled to said sense coils along said first and second linear axes, respectively.

* * * * *